(12) United States Patent
Chen

(10) Patent No.: US 7,342,220 B2
(45) Date of Patent: Mar. 11, 2008

(54) LENS ASSEMBLY HAVING FOCAL LENGTH ADJUSTABLE BY A SPACER FOR OBTAINING AN IMAGE OF AN OBJECT

(75) Inventor: Chun-Hsien Chen, Jhubei (TW)

(73) Assignee: Lumens Digital Optics, Inc., Jhubei (TW)

( * ) Notice: Subject to any disclaimer, the term of this patent is extended or adjusted under 35 U.S.C. 154(b) by 12 days.

(21) Appl. No.: 11/372,910

(22) Filed: Mar. 10, 2006

(65) Prior Publication Data

US 2006/0219882 A1 Oct. 5, 2006

(30) Foreign Application Priority Data

Mar. 31, 2005 (TW) ............................... 94110398 A

(51) Int. Cl.
*H01J 5/02* (2006.01)
(52) U.S. Cl. .................... 250/239; 250/208.1
(58) Field of Classification Search ............ 250/208.1, 250/239, 216, 214.1, 214 R; 257/80–84, 257/432–435
See application file for complete search history.

(56) References Cited

U.S. PATENT DOCUMENTS 4,896,217 A * 1/1990 Miyazawa et al. .......... 348/340
5,617,131 A * 4/1997 Murano et al. ............. 347/233

FOREIGN PATENT DOCUMENTS

JP 2005-070505 3/2005

* cited by examiner

*Primary Examiner*—Que T Le
(74) *Attorney, Agent, or Firm*—Volpe and Koenig, P.C.

(57) ABSTRACT

A lens assembly for obtaining an image of an object is provided. The lens assembly includes a lens device receiving a reflected light from the object, a circuit board carrying thereon the lens device, a spacer mounted on the circuit board, and a sensor mounted on the spacer, receiving the reflected light from the lens device and converting the reflected light into a digital signal, thereby generating the image.

20 Claims, 2 Drawing Sheets

LENS ASSEMBLY HAVING FOCAL LENGTH ADJUSTABLE BY A SPACER FOR OBTAINING AN IMAGE OF AN OBJECT

FIELD OF THE INVENTION

The present invention is related to a lens assembly, and more particularly to a lens assembly used for different sizes or standards of sensors without changing any lens devices of the lens assembly.

BACKGROUND OF THE INVENTION

Please refer to FIG. 1, which is a schematic view showing a conventional lens structure. The conventional lens structure includes a lens device 10, a circuit board 13 and a sensor 14. Further, the lens device 10 includes a lens tube 11 and a lens base 12, and the sensor 14 is mounted on the circuit board 13. The lens tube 11 further includes an end having a receptacle portion 15 for containing the sensor 13, and the end of the lens tube 11 is mounted on the circuit board 13. Moreover, the circuit board 13 is further used for mounting the lens base 12 thereon.

According to the general imaging theory, a plurality of reflected lights from an object would be received by the lens device 10, and a plurality of focused lights would be generated within the lens device 10, i.e. the reflected lights are focused on the sensor 14, by a plurality of lenses of the lens tube 11. Further, the sensor 14 could convert these focused lights into various digital signals. Then, these digital signals would be transferred to other devices by the circuit board 13 to process the following steps for showing an image or storing the image.

However, various researches for the arrangement between the lens device and the lenses have been developed by the optical lens manufacturers to provide digital images with a better definition and introduce more functions, such as an auto-focus function, a macro-mode photo function, multi-apertures, a zoom lens with a mechanical shutter and zoom ratio, etc. Such researches not only involves complex optical, optomechanical and electrical control techniques, but the expense therefor is very high. Therefore, the price for the optical lens, i.e. the lens device 10, usually is very expensive.

Besides, these techniques, such as adjustments for the alignment, the position or the focus between the optical lens and the sensor, are also quite important, and the image quality would be enhanced according to the above adjustments. In addition, the optical lens manufacturers often suggest that the size or standard of the sensor should be chosen according to the type of the optical lens. Further, these optical lenses would be used in various products, such as a digital camera, a visualizer or a digital video camera. Accordingly, most product manufacturers often accept the optical lens manufacturers' suggestion to adopt a designated size or standard of sensor in a designated optical lens.

While the product with a particular standard or size of sensor is produced by the product manufacturer, the corresponding optical lenses must be particularly provided by the optical lens manufacturer. However, the charge for re-designing and producing the particular optical lens is very costly. Therefore, the manufacturing cost and the price for the products may go up quite substantially and there will be no market for these products.

Therefore, the purpose of the present invention is to develop a lens assembly to deal with the above situations encountered in the prior art.

SUMMARY OF THE INVENTION

It is therefore a first aspect of the present invention to provide a lens assembly suitable for various sensors without changing the lens devices therein, in which the position of the sensor in the lens device could be adjusted according to the size or standard of the sensor, and the manufacturing cost for the product with the lens assembly would be decreased therewith.

It is therefore a second aspect of the present invention to provide a lens assembly with an additional spacer to change a focal length of the sensor for use in various sensors, so that the charge for re-designing and producing various optical lenses could be saved.

According to an aspect of the present invention, a lens assembly for obtaining an image of an object is provided. The lens assembly includes a lens device receiving a reflected light from the object, a circuit board carrying thereon the lens device, a spacer mounted on the circuit board, and a sensor mounted on the spacer, receiving the reflected light from the lens device and converting the reflected light into a digital signal, thereby generating the image.

Preferably, the lens assembly further includes a connector mounted between the circuit board and the spacer for conducting signals and currents coming from one of the circuit board and the space.

Preferably, the connector is one of a conducting pillar and a conducting wire.

Preferably, the lens device includes a lens tube and a lens base, and the lens base is used for mounting the lens tube on the circuit board.

Preferably, the lens tube includes a plurality of lenses.

Preferably, the lens tube further includes an end having a receptacle portion.

Preferably, the end of the lens tube is mounted on the circuit board.

Preferably, the receptacle portion is a notch.

Preferably, the sensor is one of a CMOS optical sensor and a CCD optical sensor.

Preferably, the lens assembly is an objective lens for a visualizer.

Preferably, the spacer is a printed circuit board (PCB).

Preferably, the circuit board and the spacer form a printed circuit board assembly (PCBA).

According to another aspect of the present invention, a lens assembly is provided. The lens assembly includes a circuit board, a lens tube including a plurality of lenses, a lens base including a first end and a second end, the first end mounting thereon the lens tube and the second end mounted on the circuit board, wherein the second end further includes a receptacle portion, a spacer horizontally mounted above the circuit board and within the receptacle portion, and a sensor mounted above the spacer and receiving a focused light formed from the plurality of lenses.

Preferably, the lens assembly further includes a connector mounted between the circuit board and the spacer for conducting signals and currents coming from one of the circuit board and the spacer.

Preferably, the sensor is contained within the receptacle portion.

Preferably, the sensor and the spacer have a cooperative size smaller than a containing space of the receptacle portion.

According to another aspect of the present invention, a lens assembly is provided. The lens assembly includes a circuit board, and lens device disposed on the circuit board and including a receptacle portion containing a spacer and a sensor disposed above the space.

Preferably, the spacer is horizontally disposed above the circuit board.

Preferably, the sensor receives a focused light from the lens device.

The above contents and advantages of the present invention will become more readily apparent to those ordinarily skilled in the art after reviewing the following detailed descriptions and accompanying drawings, in which:

DETAILED DESCRIPTION OF THE PREFERRED EMBODIMENTS

The present invention will now be described more specifically with reference to the following embodiment. It is to be noted that the following descriptions of preferred embodiment of this invention are presented herein for purposes of illustration and description only; it is not intended to be exhaustive or to be limited to the precise form disclosed.

Figure 1:
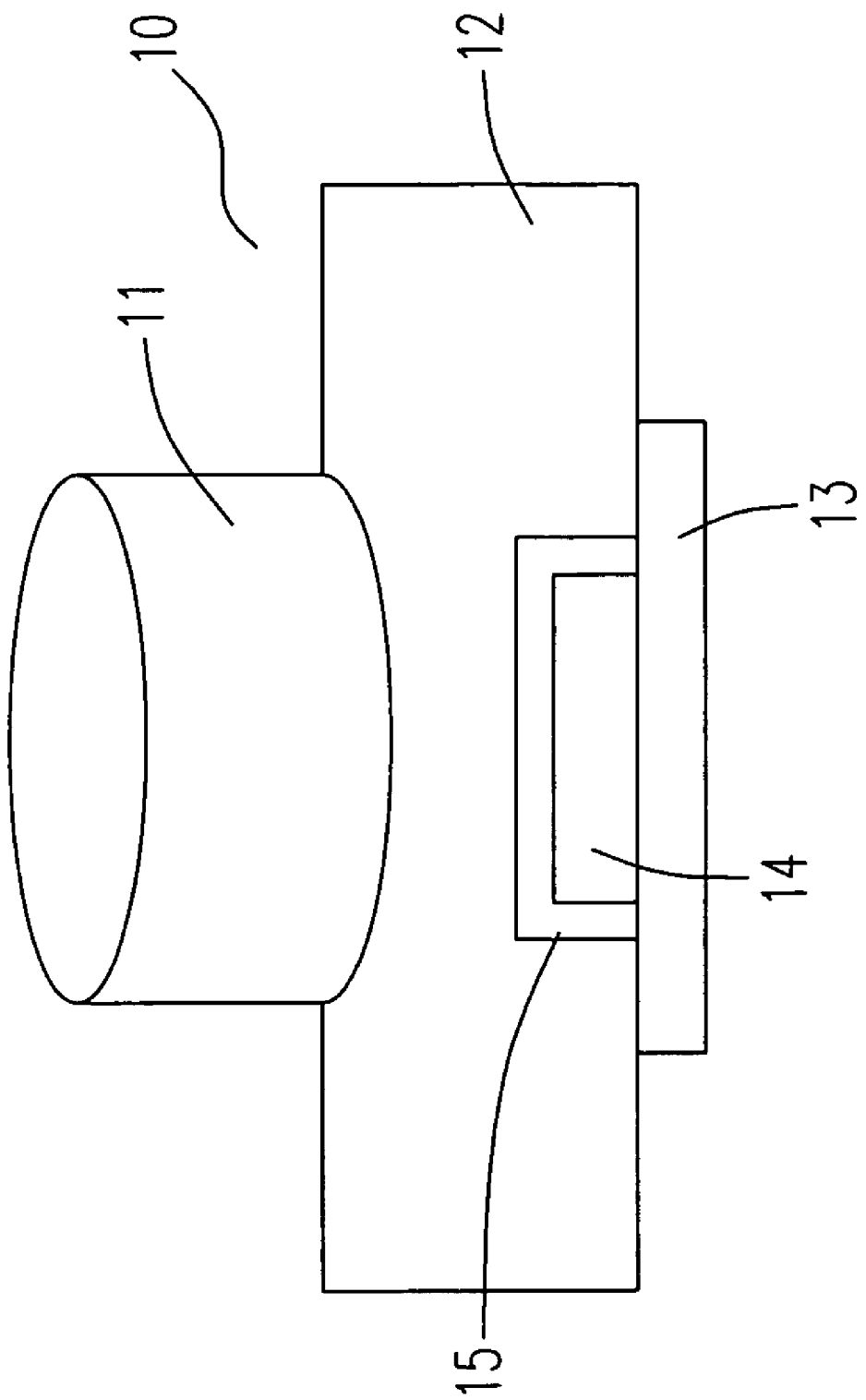
FIG. 1 is a schematic view showing a conventional lens structure.
Figure 2:
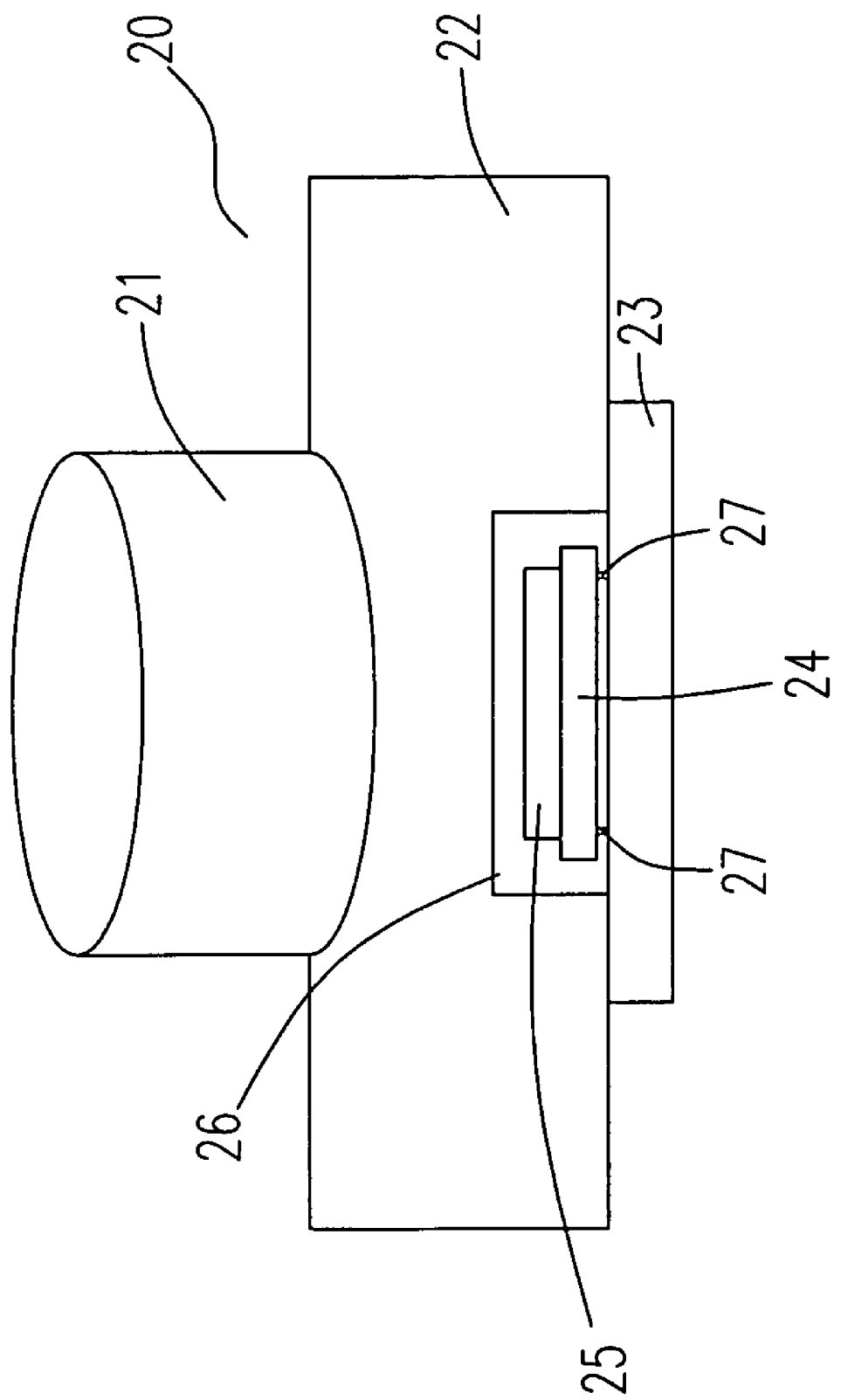
FIG. 2 is a schematic view showing a lens assembly according to a preferred embodiment of the present invention.

Please refer to FIG. 2, which is a schematic view showing a lens assembly according to a preferred embodiment of the present invention. The lens assembly includes a lens device 20, a circuit board 23, a spacer 24 and a sensor 25. Further, the lens device 20 includes a lens tube 21 and a lens base 22. The lens base 22 includes a first end and a second end, wherein the lens tube 21 is mounted on the first end and the second end is mounted on the circuit board 23, and the second end further includes a receptacle portion 26. Moreover, the sensor 25 and the spacer 24 are contained within the receptacle portion 26, the sensor 25 is mounted above the spacer 24, and the spacer 24 is horizontally mounted above the circuit board 23. In addition, the lens assembly further includes at least one connector 27 mounted between the circuit board 23 and the spacer 24 for conducting signals and currents coming from one of the circuit board 23 and the spacer 24.

While an image of an object is obtained by the lens assembly, a plurality of reflected lights from the object would be received by the lens tube 21. According to the above conventional imaging theory, a plurality of focused lights would be generated by a plurality of lenses of the lens tube 21 and received by the sensor 24. Thus, the sensor 24 could convert these focused lights into various digital signals. Then, these digital signals would be transferred to other devices by the spacer 24 and the circuit board 23 to process the following steps for showing or storing the image.

Furthermore, the connector 27 can be a conducting pillar or a conducting wire, and the receptacle portion 26 can be a notch. Further, the sensor 25 is a CMOS optical sensor or a CCD optical sensor, and the sensor 25 and the spacer 24 have a cooperative size smaller than a containing space of the receptacle portion 26. Moreover, the spacer 24 is a printed circuit board (PCB), and the circuit board 23 and the spacer 24 could form a printed circuit board assembly (PCBA). The lens assembly can be an objective lens for a visualizer.

Therefore, various sensors could be used in the lens assembly by providing the spacer 24 to change the focal length thereof only if the sensor 25 has a size smaller than the containing space of the receptacle portion 26 in the lens device 20. Further, the lens device 20 includes different imaging features according to the size or standard of the sensor 25 mounted thereon.

Take an example, the conventional lens device only uses a ⅓-inch CCD optical sensor and cannot use other sizes or standards of sensors, such as a ¼-inch CCD optical sensor or a ¼-inch CMOS one. However, a ¼-inch CCD optical sensor or a ¼-inch CMOS one could be applied in the lens device 20 of the present lens assembly and the imaging result is still good and not affected. Thus, the spacer 24 could be contained within the receptacle portion 26 and the focal length of the sensor 25 would be adjusted by changing the location of the spacer 24 in the receptacle portion 26 to conform to the standard of the sensor 25. Moreover, the manufacturing cost for the present lens assembly would not be greatly increased and digital images obtained by the present lens assembly have no distortion.

According to the above description, the present invention could provide a universal lens assembly for use in various sensors without changing any lens devices, and various sensors could be used in one lens device. Furthermore, the present invention could be achieved by using an additional spacer to change the focal length of the sensor so as to effectively save the charge for re-designing and producing various lens devices. Moreover, the manufacturing cost for the product with the lens assembly would be effectively decreased.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A lens assembly for obtaining an image of an object, comprising:
    a lens device receiving a reflected light from the object;
    a circuit board carrying thereon the lens device;
    a spacer mounted on the circuit board; and
    a sensor mounted on the spacer, receiving the reflected light from the lens device and converting the reflected light into a digital signal, thereby generating the image, wherein a distance between the sensor and the lens device is adjusted to a focal length of the lens device by the spacer.

2. The lens assembly according to claim 1 further comprising a connector mounted between the circuit board and the spacer for conducting signals and currents coming from one of the circuit board and the spacer.

3. The lens assembly according to claim 2, wherein the connector is one of a conducting pillar and a conducting wire.

4. The lens assembly according to claim 1, wherein the lens device includes a lens tube and a lens base, and the lens base is used for mounting the lens tube on the circuit board.

5. The lens assembly according to claim 4, wherein the lens tube includes a plurality of lenses.

6. The lens assembly according to claim 5, wherein the lens tube further includes an end having a receptacle portion.

7. The lens assembly according to claim 6, wherein the end of the lens tube is mounted on the circuit board.

8. The lens assembly according to claim 7, wherein the receptacle portion is a notch.

9. The lens assembly according to claim 1, wherein the sensor is one of a CMOS optical sensor and a CCD optical sensor.

10. The lens assembly according to claim 1, wherein the lens assembly is an objective lens for a visualizer.

11. The lens assembly according to claim 1, wherein the spacer is a printed circuit board (PCB).

12. The lens assembly according to claim 1, wherein the circuit board and the spacer form a printed circuit board assembly (PCBA).

13. A lens assembly, comprising:
   a circuit board;
   a lens tube including a plurality of lenses;
   a lens base including a first end and a second end, the first end mounting thereon the lens tube and the second end mounted on the circuit board, wherein the second end further includes a receptacle portion;
   a spacer horizontally mounted above the circuit board and within the receptacle portion; and
   a sensor mounted above the spacer and receiving a focused light formed from the plurality of lenses, wherein a distance between the sensor and the lens tube is adjusted to a focal length of the lens device by the spacer.

14. The lens assembly according to claim 13 further comprising a connector mounted between the circuit board and the spacer for conducting signals and currents coming from one of the circuit board and the spacer.

15. The lens assembly according to claim 14, wherein the connector is one of a conducting pillar and conducting wire.

16. The lens assembly according to claim 13, wherein the sensor is contained within the receptacle portion.

17. The lens assembly according to claim 13, wherein the sensor and the spacer have a cooperative size smaller than a containing space of the receptacle portion.

18. A lens assembly, comprising:
   a circuit board; and
   a lens device disposed on the circuit board and including a receptacle portion containing a spacer and a sensor disposed above the spacer, wherein a distance between the sensor and the lens device is adjusted to a focal length of the lens device by the spacer.

19. The lens assembly according to claim 18, wherein the spacer is horizontally disposed above the circuit board.

20. The lens assembly according to claim 18, wherein the sensor receives a focused light from the lens device.

* * * * *